(12) United States Patent
Cappelletti et al.

(10) Patent No.: US 6,410,387 B1
(45) Date of Patent: Jun. 25, 2002

(54) PROCESS FOR INTEGRATING IN A SAME CHIP A NON-VOLATILE MEMORY AND A HIGH-PERFORMANCE LOGIC CIRCUITRY

(75) Inventors: Paolo Giuseppe Cappelletti, Seveso; Alfonso Maurelli, Sulbiate, both of (IT)

(73) Assignee: STMicroelectronics, S.r.l., Agrate Brianza (IT)

( * ) Notice: Subject to any disclaimer, the term of this patent is extended or adjusted under 35 U.S.C. 154(b) by 0 days.

(21) Appl. No.: 09/449,044

(22) Filed: Nov. 24, 1999

(30) Foreign Application Priority Data

Nov. 26, 1998 (EP) .............................. 98830709

(51) Int. Cl.[7] .................. H01L 21/336; H01L 21/8234; H01L 21/8238; H01L 21/469
(52) U.S. Cl. ...................... 438/257; 438/275; 438/201; 438/216; 438/981; 438/787
(58) Field of Search ................................. 438/275, 257, 438/216, 201, 279, 287, 981, 591, 258, 787, 239, 453, 266, 267

(56) References Cited

U.S. PATENT DOCUMENTS

| | | | | |
|---|---|---|---|---|
| 5,182,719 A | | 1/1993 | Kuroda et al. ............. | 364/490 |
| 5,600,164 A | * | 2/1997 | Ajika et al. ................ | 257/321 |
| 5,663,084 A | * | 9/1997 | Yi et al. .................... | 438/453 |
| 5,668,035 A | * | 9/1997 | Fang et al. ................ | 438/239 |
| 5,768,194 A | * | 6/1998 | Matsubara et al. ......... | 365/185 |
| 5,834,352 A | * | 11/1998 | Choi ........................ | 438/275 |
| 5,861,347 A | * | 1/1999 | Maiti et al. ................ | 438/787 |
| 5,888,869 A | * | 3/1999 | Cho et al. .................. | 438/258 |
| 5,910,016 A | * | 6/1999 | Kazerounian et al. ...... | 438/258 |
| 5,926,729 A | * | 7/1999 | Tsai et al. .................. | 438/591 |
| 5,989,948 A | * | 11/1999 | Vines et al. ................ | 438/216 |
| 6,017,797 A | * | 1/2000 | Furukawa .................. | 438/275 |
| 6,087,225 A | * | 7/2000 | Broonner et al. ........... | 438/275 |
| 6,133,164 A | * | 10/2000 | Kim .......................... | 438/981 |
| 6,165,849 A | * | 12/2000 | An et al. .................... | 438/275 |
| 6,165,918 A | * | 12/2000 | Jia et al. .................... | 438/981 |
| 6,228,721 B1 | * | 5/2001 | Yu ............................. | 438/275 |
| 6,261,978 B1 | * | 7/2001 | Chen et al. ................. | 438/981 |

FOREIGN PATENT DOCUMENTS

| | | |
|---|---|---|
| EP | 0 854 590 A | 7/1998 |
| FR | 0591598 A1 * | 4/1994 |
| JP | 05 021811 A | 1/1993 |
| JP | 405259409 A * | 10/1993 |
| JP | 405347416 A * | 12/1993 |
| JP | 406104432 A * | 4/1994 |
| JP | 406151783 A * | 5/1994 |
| JP | 07 283322 A | 10/1995 |

* cited by examiner

*Primary Examiner*—Matthew Smith
*Assistant Examiner*—Chuong A Luu
(74) *Attorney, Agent, or Firm*—Lisa K. Jorgenson; Robert Iannucci; SEED IP Law Group PLLC

(57) ABSTRACT

A process for the manufacturing of an integrated circuit including a low operating voltage, high-performance logic circuitry and an embedded memory device having a high operating voltage higher than the low operating voltage of the logic circuitry, providing for: on first portions of a semiconductor substrate, forming a first gate oxide layer for first transistors operating at the high operating voltage; on second portions of the semiconductor substrate, forming a second gate oxide layer for memory cells of the memory device; on the first and second gate oxide layers, forming from a first polysilicon layer gate electrodes for the first transistors, and floating-gate electrodes for the memory cells; forming over the floating-gate electrodes of the memory cells a dielectric layer; on third portions of the semiconductor substrate, forming a third gate oxide layer for second transistors operating at the low operating voltage; on the dielectric layer and on the third portions of the semiconductor substrate, forming from a second polysilicon layer control gate electrodes for the memory cells, and gate electrodes for the second transistors; in the first portions of the semiconductor substrate, forming source and drain regions for the first transistors; in the second portions of the semiconductor substrate, forming source and drain regions for the memory cells; in the third portions of the semiconductor substrate, forming source and drain regions for the second transistors.

24 Claims, 10 Drawing Sheets

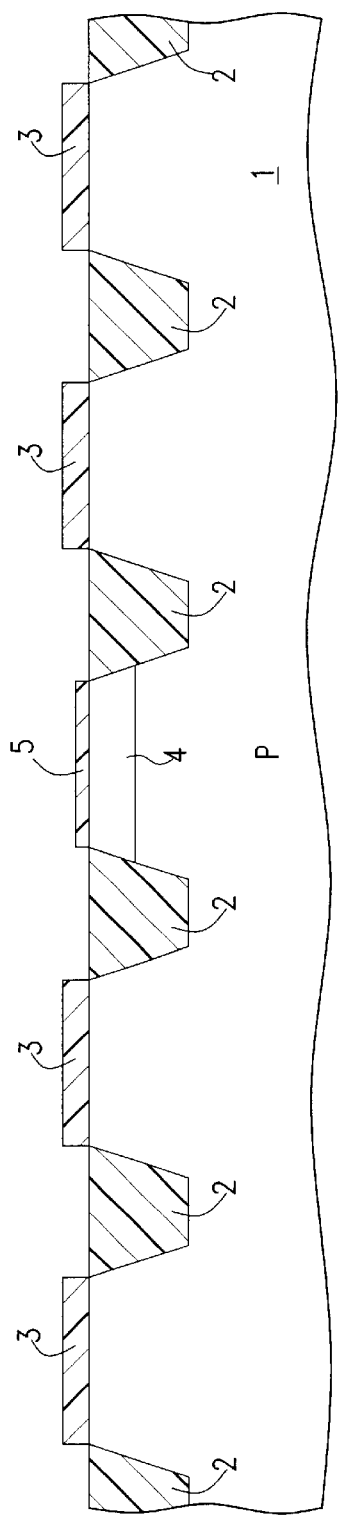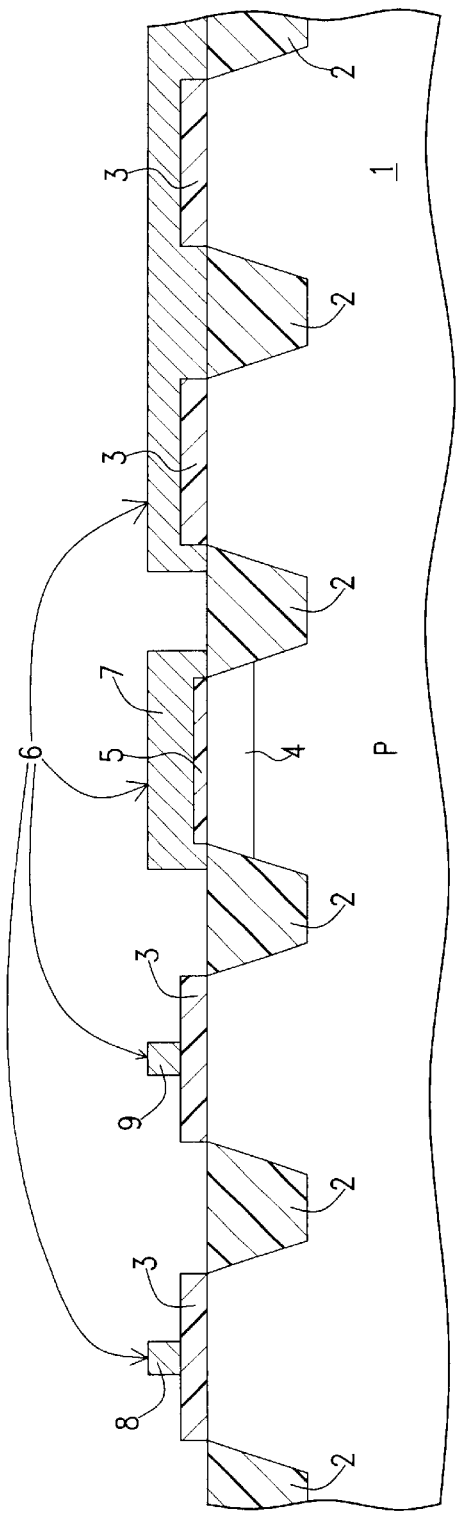

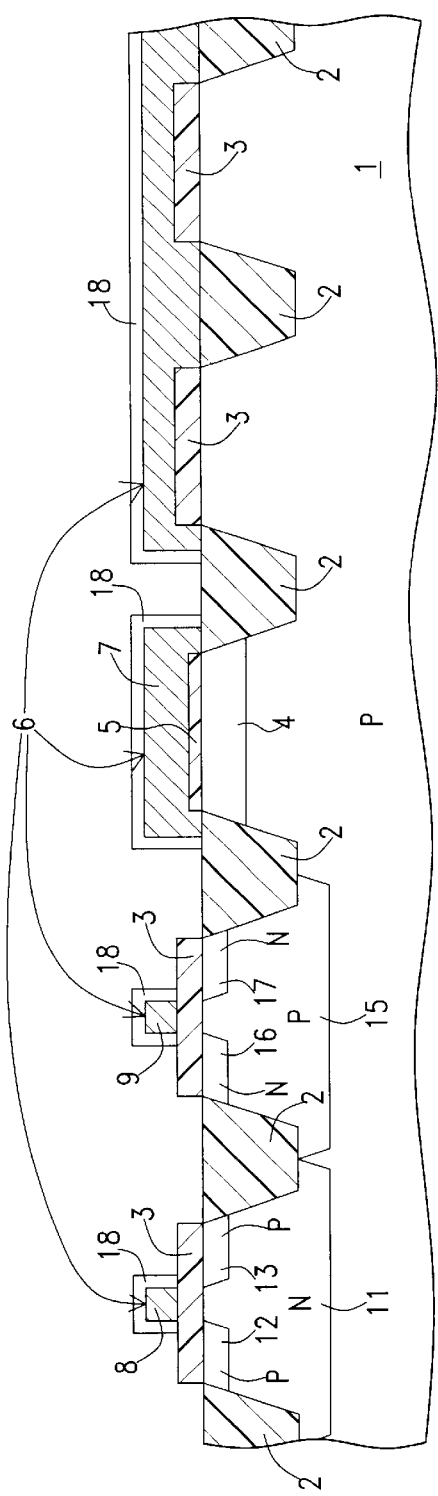
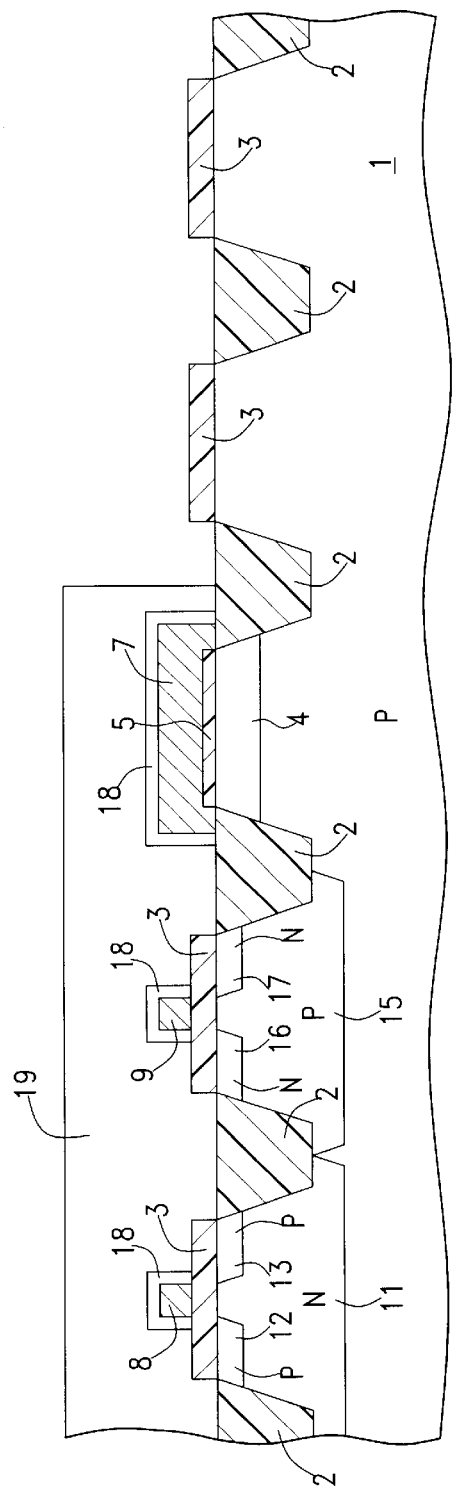

PROCESS FOR INTEGRATING IN A SAME CHIP A NON-VOLATILE MEMORY AND A HIGH-PERFORMANCE LOGIC CIRCUITRY

TECHNICAL FIELD

The present invention relates to a process for integrating in a same chip a non-volatile memory and a high-performance circuitry.

BACKGROUND OF THE INVENTION

The evolution of integration technologies aiming at the formation of whole electronic systems or subsystems on a single semiconductor chip involves the capability of combining a logic circuitry with memories having a high degree of complexity.

In particular there is an increasing demand for the integration of non-volatile memories, particularly of the Flash EEPROM type, in CMOS manufacturing processes for logic circuitries of high performance.

This kind of combination becomes more and more difficult, from a technical viewpoint, due to the different requirements in terms of operating voltages.

The natural evolution of CMOS processes for high-performance logic circuitries is leading to a reduction of the operating voltage so to allow scaling of transistors' size; the shrinking and operating voltage reduction determine a corresponding reduction of the transistors' gate oxide thickness and junction depth.

On the other hand, non-volatile memories require relatively high programming voltages, and the values of such voltages are not expected to significantly decrease in the coming future, at least as far as floating-gate non-volatile memories are concerned.

Considering by way of example a 0.25 $\mu$m technology, transistors obtained by means of a CMOS process devised for high-performance logic circuitries are optimized for operating in a voltage supply value range of 0.9–2.5 V; these transistors have a gate oxide approximately 5 nm thick, and source/drain junctions capable of withstanding a voltage not higher than 8–10 V.

On the contrary, a Flash EEPROM memory requires a programming voltage in the range of 10–12 V (the programming voltage is even higher for other kinds of non-volatile memories); transistors capable of withstanding these voltages must have gate oxides with a thickness in the range 15–18 nm, and source/drain junctions with a breakdown voltage higher than the programming voltage.

It is not easy to conciliate these contrasting needs. From the one hand, any attempt to modify the structure of the transistors of an advanced CMOS process to make them capable of withstanding the relatively high voltages required by non-volatile memories results in an unacceptable degradation of the performance of the logic circuitry. On the contrary, the complete duplication of the peripheral structures for obtaining both high-performance CMOS transistors and transistors capable of sustaining high voltages greatly increases the number of masks of the manufacturing process.

A process for the manufacturing of Flash EEPROM memories of relatively high density (i.e., greater than 256–512 Kbits) requires two polycrystalline silicon layers, the lower one ("first poly") used for forming the floating gates of the memory cells, the upper one ("second poly") used for forming both the control gates of the memory cells and the gates of transistors. This process additionally requires at least two different thin oxide layers: one, with thickness of about 10 nm, is formed between the substrate surface and the lower polysilicon layer, works as a gate oxide for the memory cells; the other one, with thickness higher than 15 nm, is formed between the substrate and the upper polysilicon layer and forms the gate oxide of the transistors.

In some manufacturing processes, in order to improve the memory device performance at low voltages, transistors with a thin gate oxide (7–10 nm) are also provided; such transistors have a gate electrode formed from the second poly. However, in order to minimize the required number of additional masks, these transistors with thin gate oxide shares several structural elements with the transistors of thicker gate oxide for handling the relatively high voltages.

When it is desired to integrate a non-volatile memory, for example a Flash EEPROM memory, by means of advanced CMOS manufacturing processes, the features of the high-performance transistors must be preserved. To do this, the high-performance transistors cannot share common structural elements with the transistors for handling the relatively high voltages required by the memory cells. So, it is not sufficient to provide for the formation of two different gate oxides, and one or two masks for adjusting the threshold voltages. Extra masks would be needed to provide ad-hoc high-voltage source and drain junctions for high voltage transistors, and then the number of additional masks could easily become excessively high.

SUMMARY OF THE INVENTION

In view of the state of the art described, it is an object of the present invention that of providing a process for integrating in a same chip a non-volatile memory and a high-performance logic circuitry.

According to an embodiment of the present invention, this object has been achieved by means of a process for the manufacturing of an integrated circuit including a low operating voltage, high-performance logic circuitry and an embedded memory device having a high operating voltage higher than said low operating voltage of the logic circuitry. The process includes:

on first portions of a semiconductor substrate, forming a first gate oxide layer for first transistors operating at said high operating voltage;

on second portions of the semiconductor substrate, forming a second gate oxide layer for memory cells of the memory device;

on said first and second gate oxide layers, forming from a first polysilicon layer gate electrodes for the first transistors, and floating-gate electrodes for the memory cells;

forming over the floating-gate electrodes of the memory cells a dielectric layer;

on third portions of the semiconductor substrate, forming a third gate oxide layer for second transistors operating at said low operating voltage;

on the dielectric layer and on said third portions of the semiconductor substrate, forming from a second polysilicon layer control gate electrodes for the memory cells, and gate electrode for the second transistors;

in said first portions of the semiconductor substrate, forming source and drain regions for the first transistors;

in said second portions of the semiconductor substrate, forming source and drain regions for the memory cells;

in said third portions of the semiconductor substrate, forming source and drain regions for the second transistors.

BRIEF DESCRIPTION OF THE DRAWINGS

The features and advantages of the present invention will now be made apparent by the following detailed description of one embodiment thereof, illustrated by way of a non-limiting example only in the annexed drawings, wherein:

FIGS. 1 to 20 are cross-sectional views showing the relevant steps of a manufacturing process according to the present invention.

DETAILED DESCRIPTION OF THE INVENTION

With reference to the drawings, starting from a semiconductor substrate 1, for example of P type, thick oxide isolation regions 2 are formed over the substrate. By way of example, the isolation regions 2 can be shallow trenches filled in with oxide.

If desired, at this stage a dopant can be implanted into the substrate 1 to form buried wells for the memory cells. This is for example the case of triple-well Flash EEPROM memories.

Figure 1:
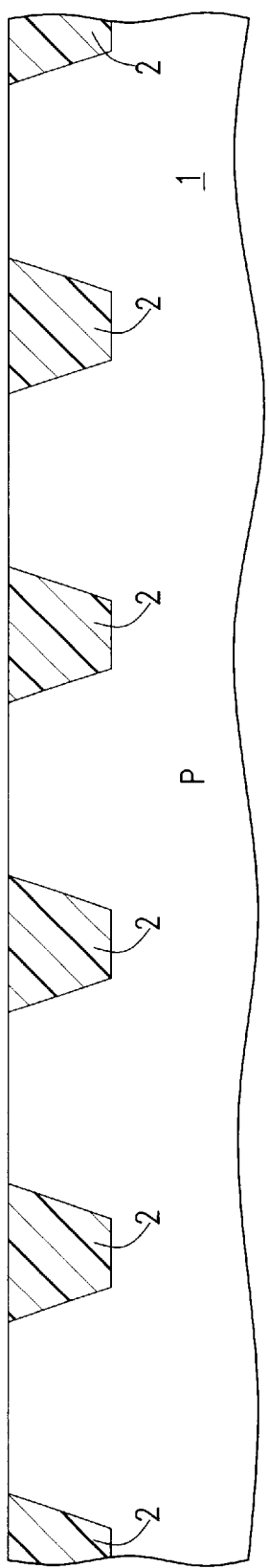
Figure 2:
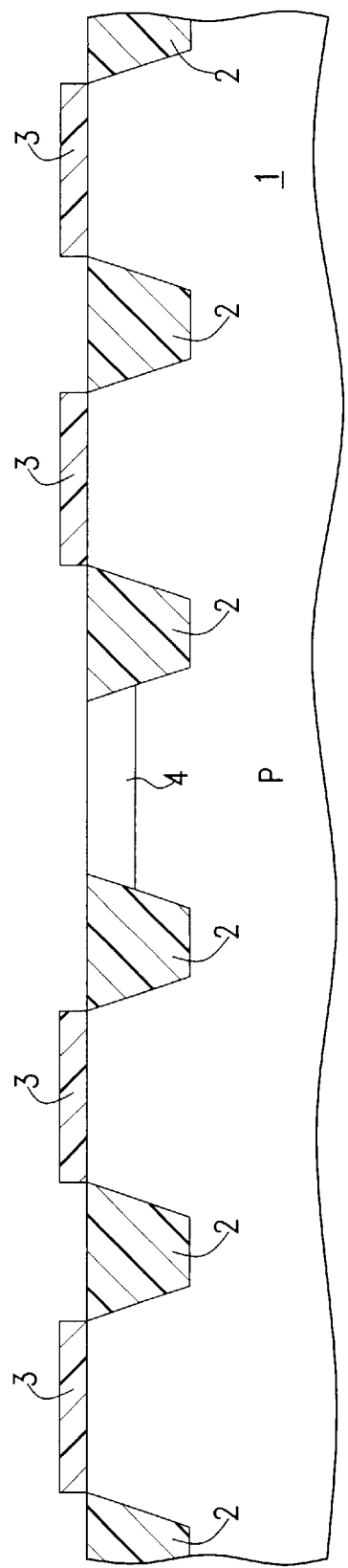

Then an oxide layer 3 is formed over the surface of the substrate 1. Oxide layer 3, having a thickness of 100–200 Å, will form the gate oxide for the high-voltage transistors, i.e., those transistors which shall handle the high voltages required by the memory cells. After having formed the oxide layer 3, a mask is applied to the substrate surface, and a P type dopant, typically boron in a dose of $1 \times 10^{12} – 1 \times 10^{13}$ at/cm$^2$, is selectively implanted in the region of the substrate 1 where the memory cells are to be formed. This implant is used to adjust the threshold voltage of the memory cells. By means of the same mask, the oxide layer 3 is selectively removed from the region of the substrate 1 where the memory cells are to be formed. After this steps, the structure is that shown in FIG. 2, where 4 is a region wherein the dopant for cells' threshold voltage adjustment has been introduced and from the surface of which the oxide layer 3 has been removed.

Then, as shown in FIG. 3, an oxide layer 5 thinner than oxide layer 3 is formed over region 4. Oxide layer 5 has a typical thickness of 70–110 Å and will act as a gate oxide for the memory cell (tunnel oxide in the particular case of EEPROM or Flash EEPROM memory cells).

Then, a first polysilicon layer 6 is deposited over the surface of the chip. A mask is then applied and the first polysilicon layer is then selectively etched to define floating gates 7 for the memory cells. At the same time, gate electrodes 8, 9 for the high-voltage transistors are defined in the first polysilicon layer 6. The first polysilicon layer 6 is also left over the regions of the substrate 2 wherein low-voltage, high-performance transistors for the logic circuitry are to be formed. After this step, the structure is that shown in FIG. 4.

Then, a mask 10 is applied and an N type dopant, typically phosphorus, is selectively implanted in a dose of $1–5 \times 10^{12}$ at/cm$^2$ to form N type wells 11 for containing P-channel high-voltage transistors. If necessary or desired, a further implant can be performed for the adjustment of the threshold voltage of the P-channel high-voltage transistors. These implants must be carried out at an energy sufficient to make the dopants penetrate under the oxide layer 3 and polysilicon gate 8. Suitable implantation energies are 150–250 KeV and 250–400 KeV.

Figure 5:
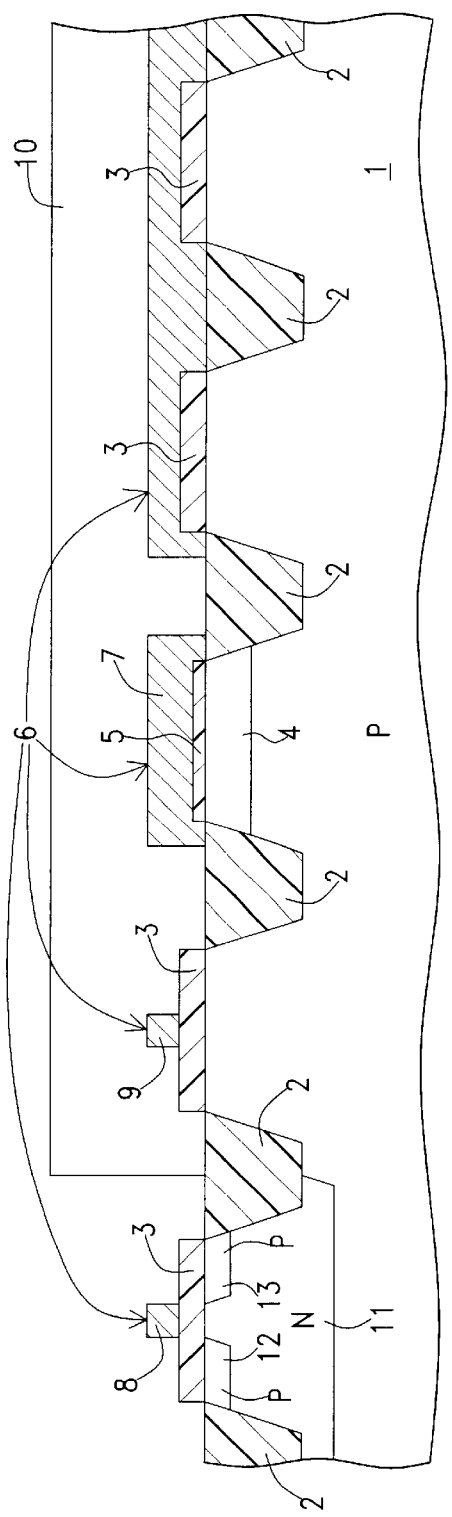

By means of the same mask 10, a P type dopant, typically BF$_2$ is implanted into the N type wells 11 in a dose of $1 \times 10^{13} – 1 \times 10^{14}$ at/cm$^2$, to form lightly doped source and drain regions 12, 13 of the P-channel high-voltage transistors, at the side of the gate electrode 8. This implant is performed at a lower energy compared to the previous implant(s), not to make the P type dopant penetrate under the gate electrode 8. A suitable energy is 30–70 KeV. After these steps, the structure is that shown in FIG. 5.

Mask 10 is then removed.

A similar mask 14 is then applied. Mask 14 covers the regions of the chip where the P-channel high-voltage transistors, the memory cells and the low-voltage, high-performance transistors of the logic circuitry are to be integrated. Using mask 14, a P type dopant such as B is then selectively implanted into substrate 2 to form P type wells 15 for the N-channel high-voltage transistors. A suitable dose is for example $1 \times 10^{12} – 1 \times 10^{13}$ at/cm$^2$ and a suitable implantation energy is 150–300 KeV.

By means of the same mask 14, an N type dopant such as P is implanted into the P type wells 15 in a dose of $1 \times 10^{13} – 1 \times 10^{14}$ at/cm$^2$ and at an energy of 50–100 KeV to form lightly doped N type source and drain regions 16, 17 for the N-channel high-voltage transistors.

Figure 6:
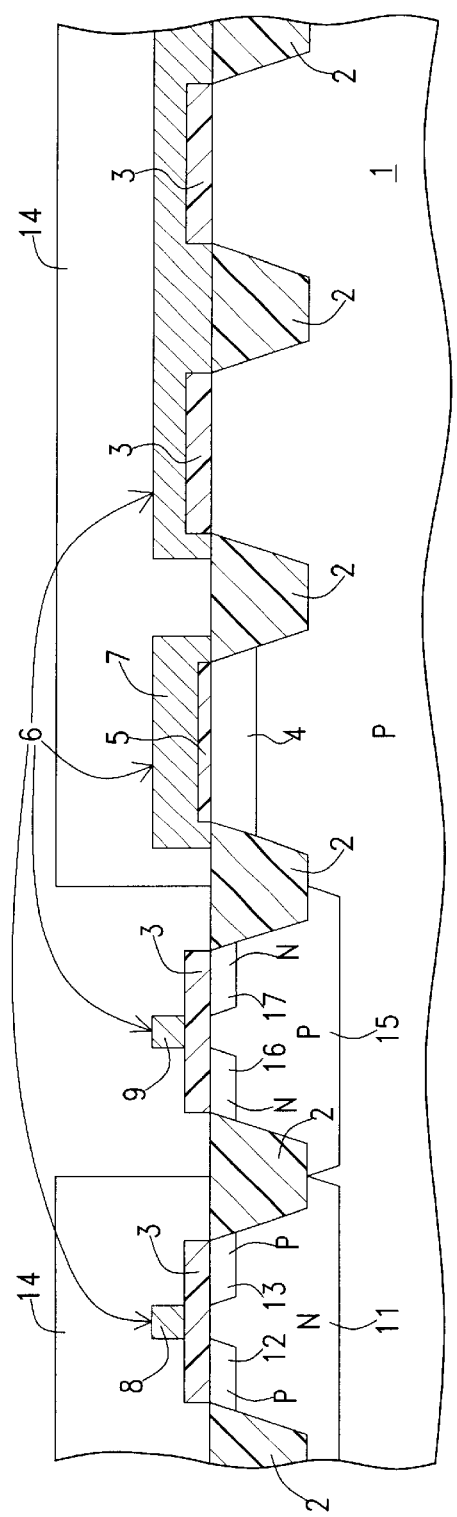

After these steps the structure is that shown in FIG. 6.

Then, as shown in FIG. 7, a dielectric layer 18 is deposited over the surface of the chip. Preferably, dielectric layer 18 is a triple layer of oxide-nitride-oxide.

Afterwards, a mask 19 is applied to the chip. Mask 19 covers the regions of the chip wherein the memory cells and the high-voltage transistors are to be integrated. Mask 19 leaves uncovered the regions of the chip wherein low-voltage high-performance transistors of the logic circuitry are to be integrated. This mask is normally provided in manufacturing processes for floating-gate memories; conventionally, this masks only covers the regions of the chip for the floating-gate memory cells, leaving all the remaining of the chip surface uncovered. According to this invention, the mask also covers the regions for the high-voltage transistors.

Then, using the above mask, an etching process is carried out to selectively etch and remove the dielectric layer 18 and the first polysilicon layer 6 from the region of the chip dedicated to the low-voltage high-performance transistors of the logic circuitry.

After these steps, the resulting structure is that shown in FIG. 8.

Mask 19 is subsequently removed.

Figure 9:
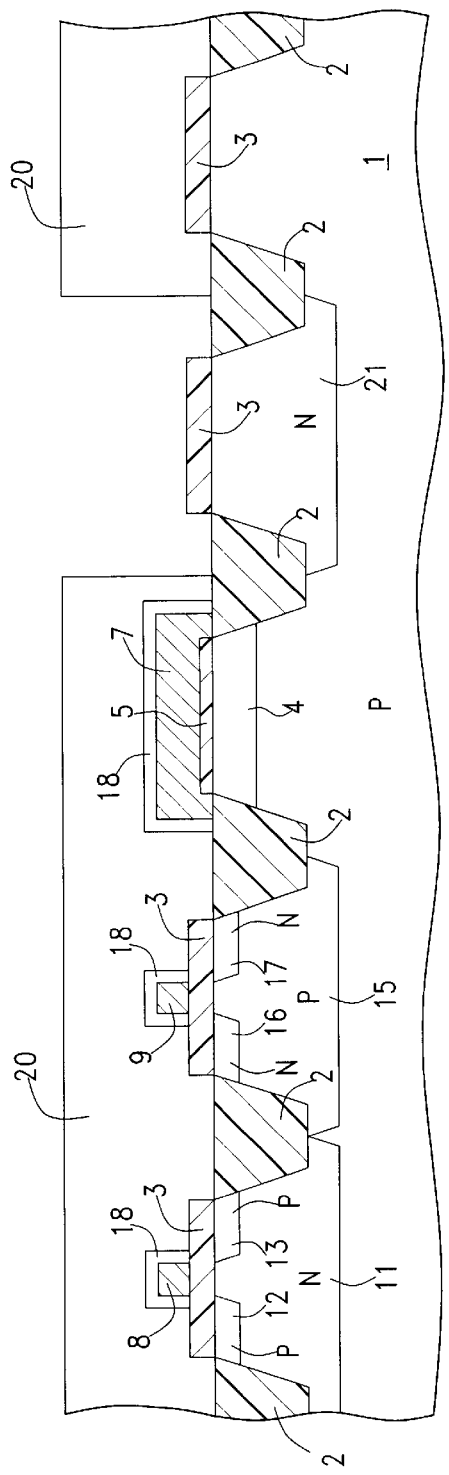

As shown in FIG. 9, a mask 20 is applied to the chip. Mask 20 covers the regions dedicated to the memory cells and the high-voltage transistors, as well as regions of the chip dedicated to the integration of N-channel low-voltage transistors for the logic circuitry. Mask 20 leaves uncovered the regions of the chip dedicated to P-channel low-voltage transistors of the logic circuitry. An N type dopant, such as P, is then selectively implanted in a sequence of implantation steps into the substrate 2 using mask 20 to form an N type well 21 for the low-voltage P-channel transistors. Suitable implantation dose and energies are $1 \times 10^{12} – 1 \times 10^{13}$ at/cm$^2$ and 50–500 KeV depending on the kind of implant.

Figure 10:
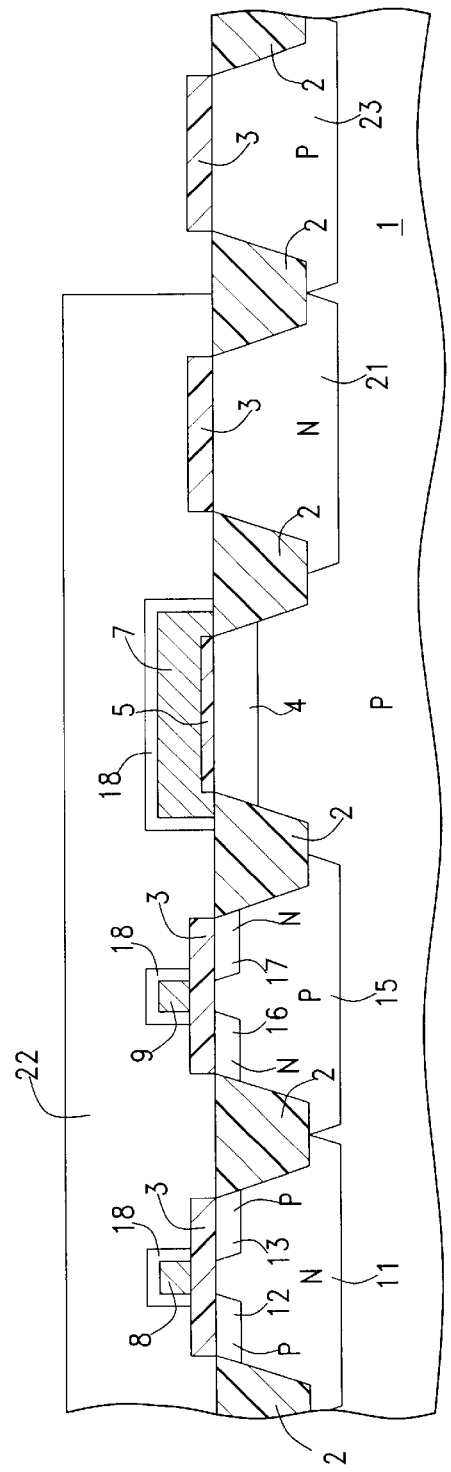

Mask 20 is then removed. As shown in FIG. 10, a complementary mask 22 is applied to the chip. A P type dopant such as B is then implanted in a sequence of implantation steps into the substrate 2 to form P type well 23 for the low-voltage N-channel transistors of the logic circuitry. Suitable implantation dose and energies are $1 \times 10^{12} – 1 \times 10^{13}$ at/cm$^2$ and 30–300 KeV.

Then, the oxide layer 3 is removed from the regions of the chip dedicated to the low-voltage high-performance transistors of the logic circuitry, and a further gate oxide layer 24 is grown over the substrate 2 in such regions, i.e., over the N type and P type wells 21, 23. Gate oxide 24 has a preferable thickness of 40–60 Å.

A second polysilicon layer 25 is then deposited over the whole surface of the chip.

Figure 11:
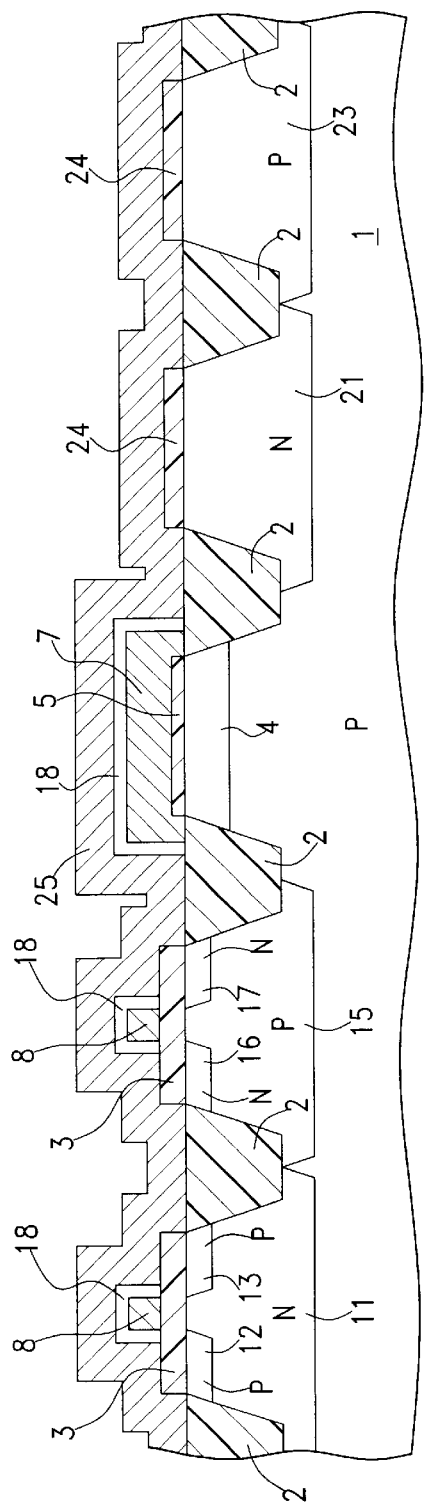

After these steps, the resulting structure is that shown in FIG. 11.

Figure 12:
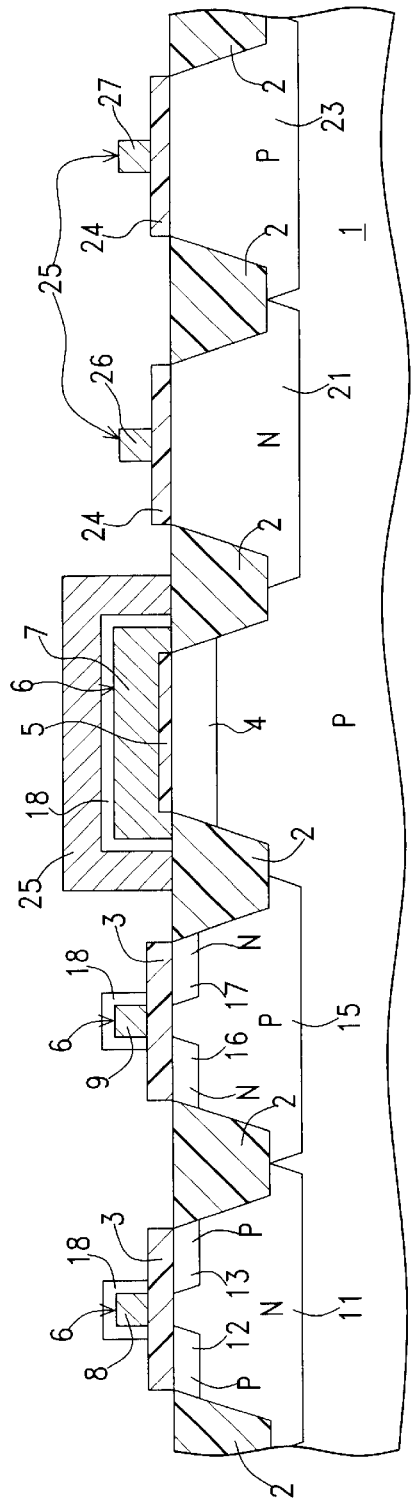

The second polysilicon layer 25 is then submitted to a first selective etching, to define gate electrodes 26, 27 for the low-voltage N- and P-channel transistors of the logic circuitry. During this etching, the second polysilicon layer 25 is not removed from the region of the chip dedicated to the memory cells. That means that the second polysilicon layer is removed from the high-voltage transistors. The resulting structure is shown in FIG. 12.

Figure 13:
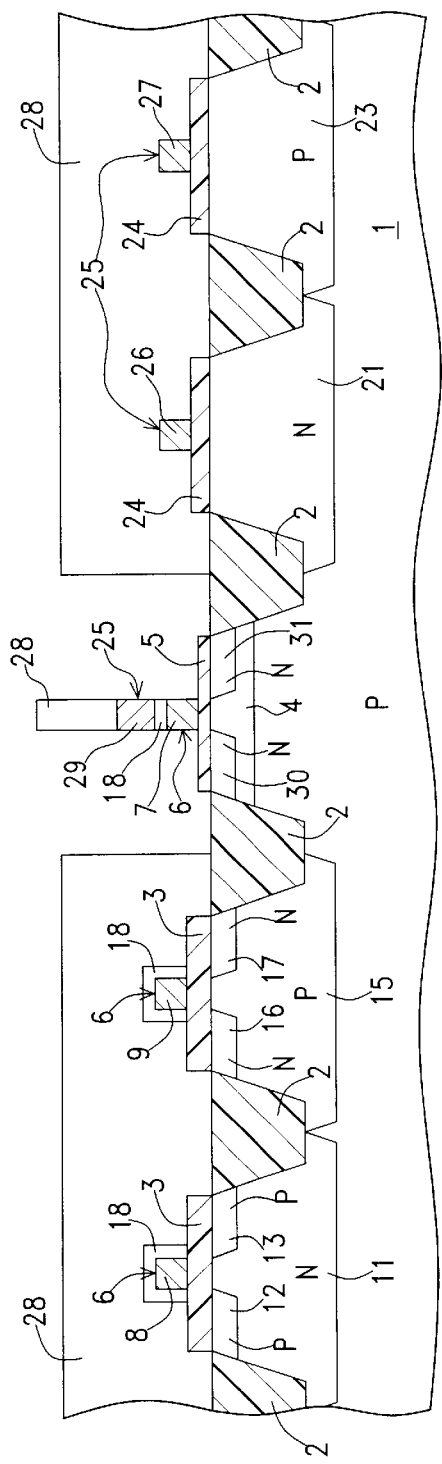

Then, a mask 28 is applied to the chip, as shown in FIG. 13. Mask 28 covers the regions of the chip dedicated to the high-voltage transistors, as well as the regions of the chip dedicated to the low-voltage transistors. Mask 28 also covers portions of the region dedicated to the floating-gate memory cells.

Using mask 28, a selective etching is carried out to remove the second polysilicon layer 25 and thus define control gate electrodes 29 of the memory cells. The etching process also provides for the self-aligned etching of the dielectric layer 18 and the first polysilicon layer 6, thus completely defining the gate structure of the memory cells.

Using the same mask 28, an N type dopant such as As is implanted into region 4 to form source and drain regions 30, 31 of the memory cells. Suitable implant dose and energy are $1-5 \times 10^{15}$ at/cm$^2$ and 40–100 KeV.

After these steps, the resulting structure is that shown in FIG. 13.

Figure 14:
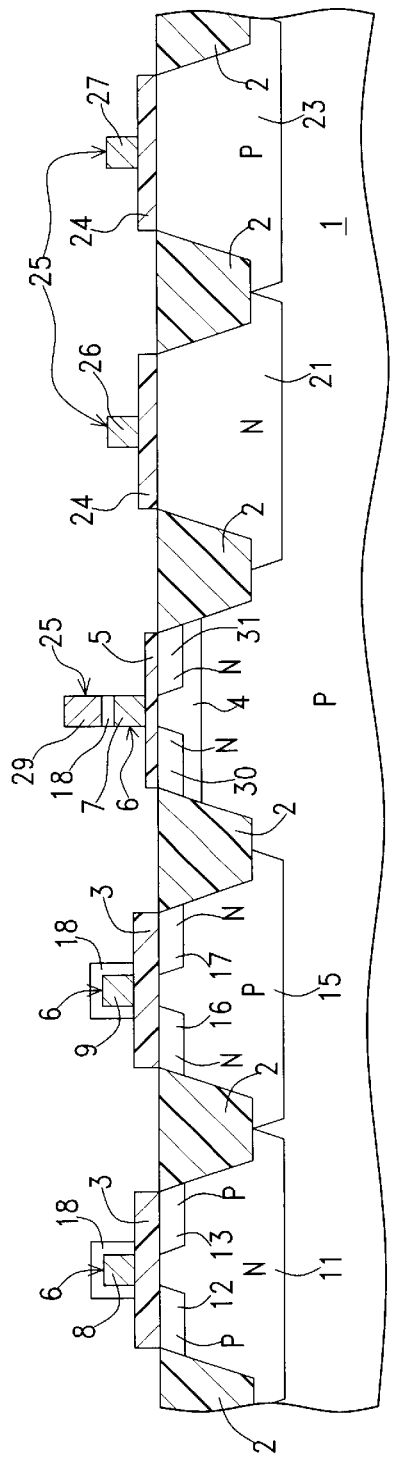

Mask 28 is then removed. Preferably, a reoxidation of the source and drain regions is performed at this stage. The resulting structure is that shown in FIG. 14.

A mask 32 is then applied to the chip. Mask 32 leaves uncovered the regions of the chip dedicated to the N-channel low-voltage transistors of the circuitry. Using mask 32 an N type dopant such as P or As is implanted into the low-voltage P type wells 23 to form lightly doped source and drain regions 33, 34 (Lightly-Doped Drain or LDD regions) for the low-voltage N-channel transistors of the circuitry. Suitable dose and energy are $1 \times 10^{13}-1 \times 10^{14}$ at/cm$^2$ (for both P and As) and 40–70 KeV for P, or 70–120 KeV for As.

Figure 15:
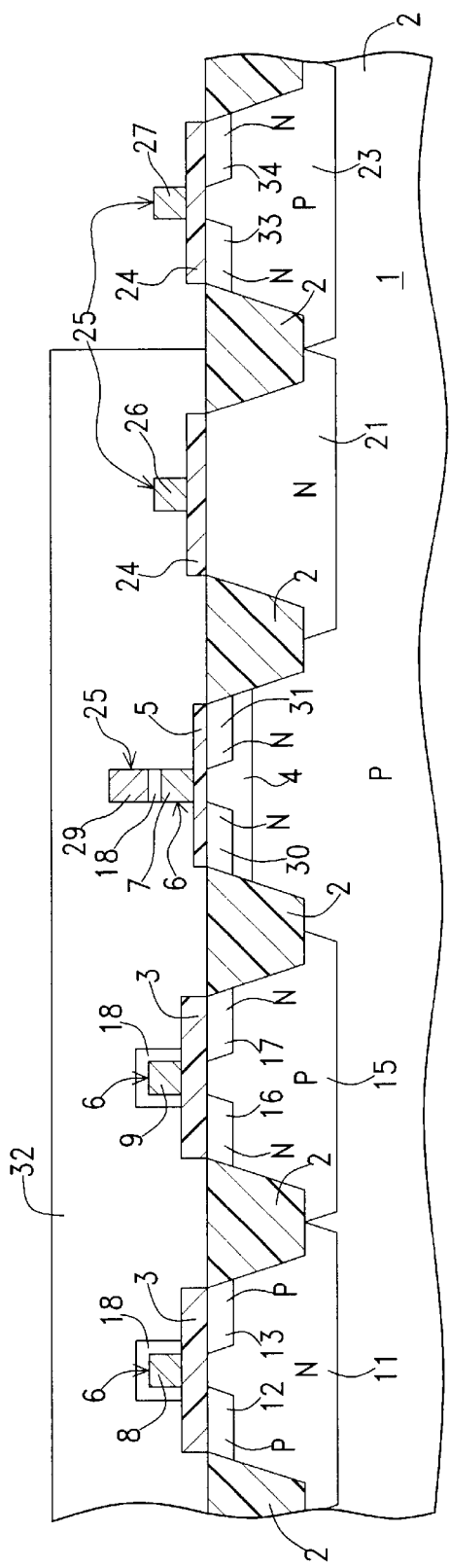

After these steps, the resulting structure is that shown in FIG. 15.

Mask 32 is then removed, and a complementary mask 35 is applied to the chip. Mask 35 leaves uncovered the regions of the chip dedicated to the low-voltage P-channel transistors of the logic circuitry. Similarly, a P type dopant such as B or BF$_2$ is implanted into the low-voltage N type wells 21 to form lightly doped P type source and drain regions 36, 37 (LDD regions) for the low-voltage P-channel transistors of the circuitry. Suitable dose and energy are $1 \times 10^{13}-1 \times 10^{14}$ at/cm$^2$ (for both B and BF$_2$) and 5–10 KeV for B, or 30–50 KeV for BF$_2$.

Figure 16:
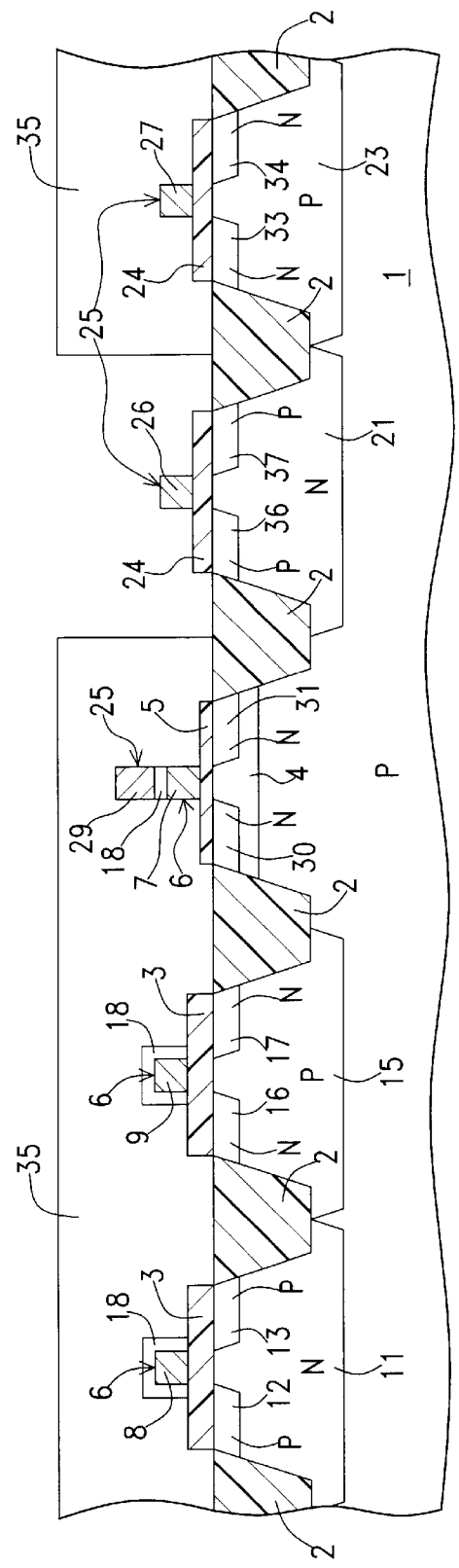

After these steps, the resulting structure is that shown in FIG. 16.

Figure 17:
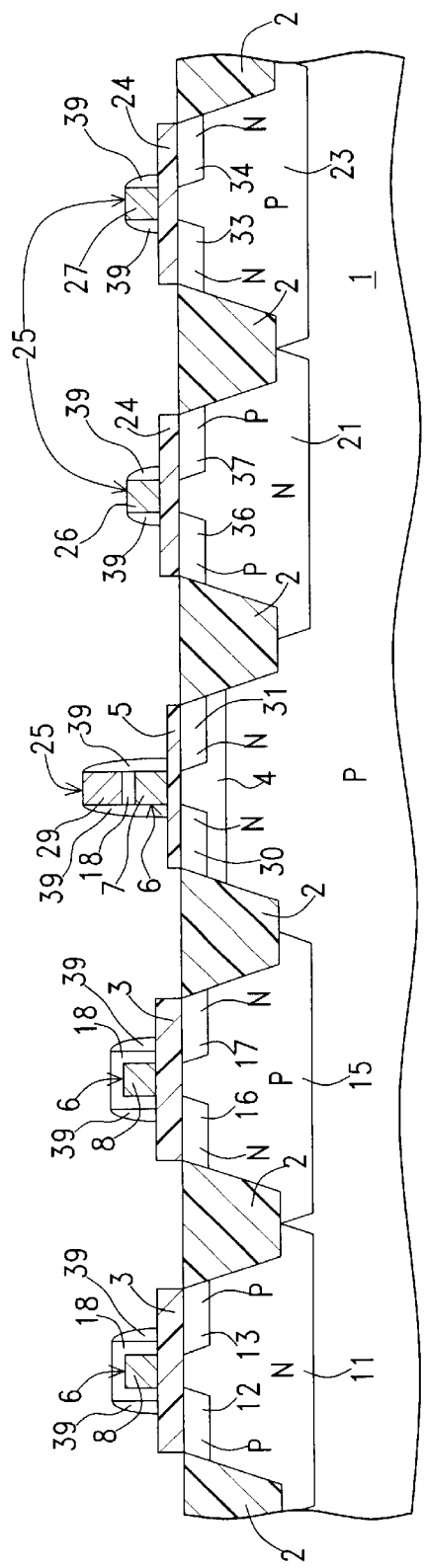

Afterwards, a layer of a dielectric material, such as TEOS, is deposited over the entire chip. The layer of dielectric material is then submitted to an etching process to form sidewall spacers 39 at the sides of all the gate structures, as shown in FIG. 17.

Figure 18:
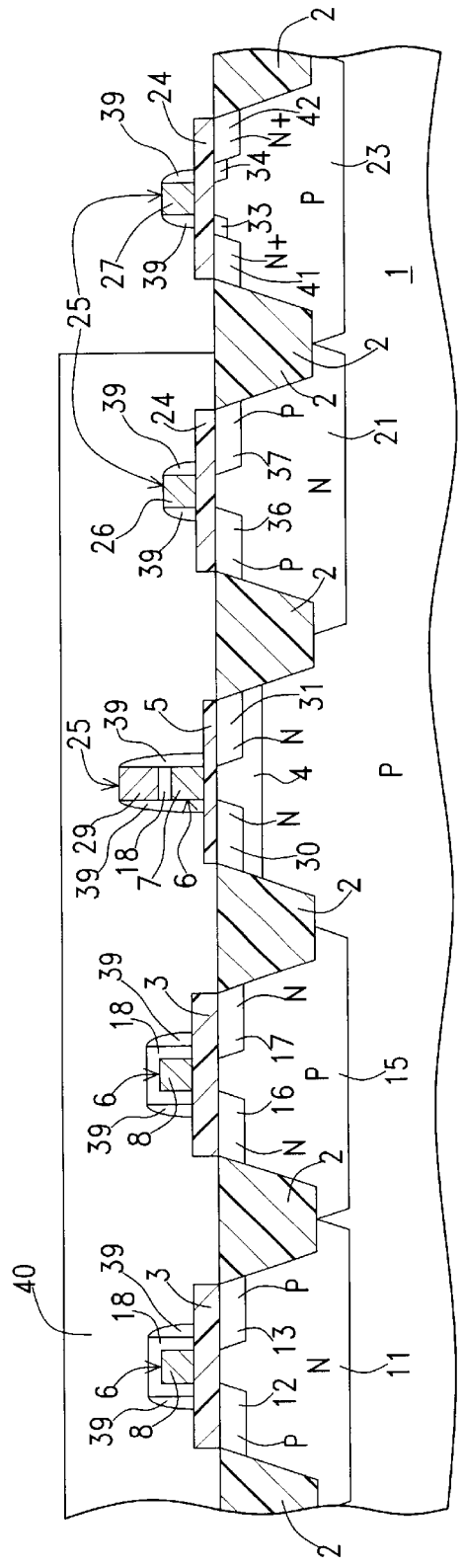

Then a mask 40 is applied to the chip. As shown in FIG. 18, mask 40 leaves uncovered the regions of the chip for the low-voltage N-channel transistors of the logic circuitry. Using mask 40, a relatively heavy dose of an N type dopant such as As is implanted into the low-voltage P type wells 23 to form heavily doped source and drain regions 41, 42 for the low-voltage N-channel transistors of the circuitry. Suitable dose and energy are $1-5 \times 10^{15}$ at/cm$^2$ and 50–120 KeV. After these steps, the resulting structure is that shown in FIG. 18.

Figure 19:
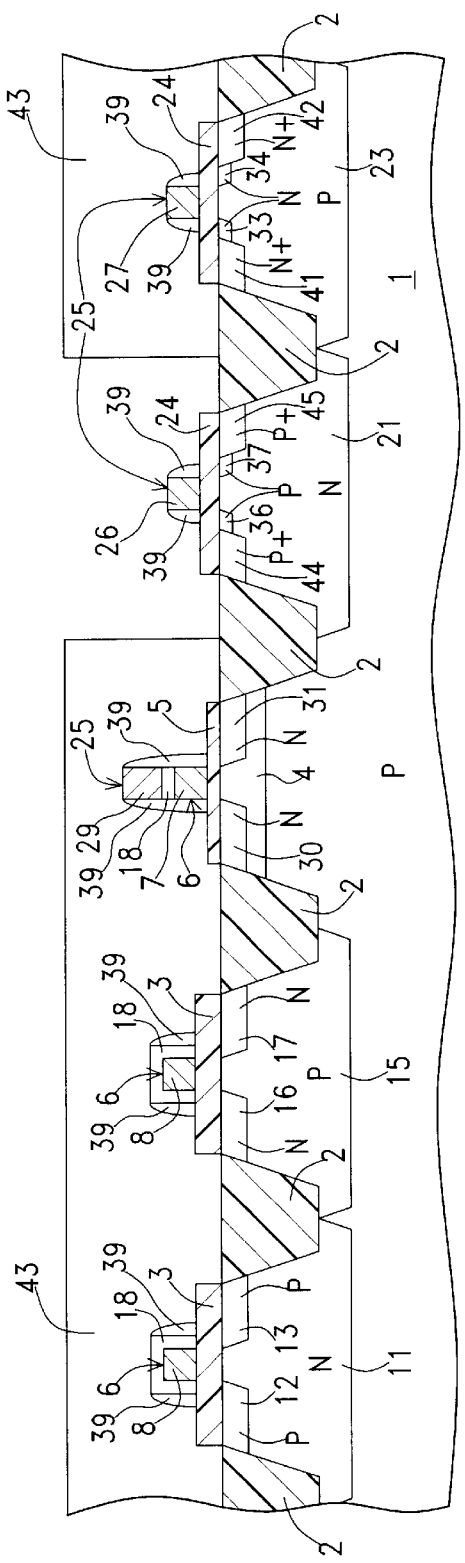

Mask 40 is then removed, and a complementary mask 43 is applied that leaves uncovered the regions of the chip dedicated to the low-voltage P-channel transistors of the logic circuitry. Using mask 43, a relatively heavy dose of a P type dopant such as B is implanted into the low-voltage N type wells 21 to form heavily doped source and drain regions 44, 45 for the low-voltage P-channel transistors of the logic circuitry. Suitable dose and energy are $1-5 \times 10^{15}$ at/cm$^2$ and 5–10 KeV. FIG. 19 shows the structure after these steps.

Figure 20:
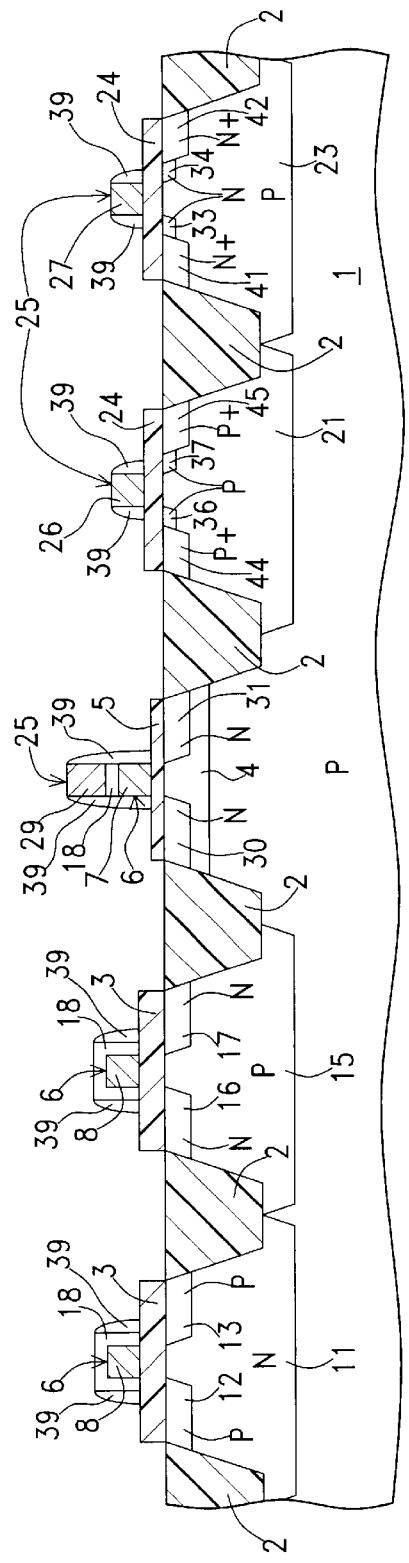

Mask 43 is then removed. The resulting structure is that shown in FIG. 20.

The process goes on with conventional steps, such as back-lapping, rapid thermal processes, salicide formation (with preliminary application of a salicide protection mask), interlevel dielectric formation, contact opening definition, metal deposition and definition etc. etc.

One of the main aspects of the present invention is the use of the same polysilicon layer (the first polysilicon layer) for forming both the floating gates of the memory cells and the gate electrodes of the high-voltage transistors, in the context of a manufacturing process for embedding a memory device in a low-voltage high-performance circuitry. In other words, a same mask is used to define the floating gates of the memory cells and the gate electrodes of the high-voltage transistors. Besides, this approach allows also to separate completely source and drain implants for high-voltage transistors from source and drain implants for low-voltage transistors without any additional extra mask.

The above aspect confers a modular nature to the manufacturing process. The steps for the formation of the memory cells and the high-voltage transistors are grouped together to form a first block of steps, which are carried out first. The steps for the formation of the low-voltage, high-performance circuitry are grouped together to form a second block of steps, which are carried out after the first block of steps. This differs from the conventional processes for the manufacturing of floating-gate non-volatile memory cells, in which the steps for the formation of the memory cells and the high-voltage components are intermixed with the steps for the formation of the low-voltage components.

The block of steps for the formation of the memory cells and the high-voltage components does not depend on the specific technology to be used.

The process according to the present invention allows to easily integrate a memory, particularly a non-volatile memory requiring relatively high voltages, in a process for a low-voltage, high-performance logic circuitry. The integration of the memory requires a minimum of additional masks. For example, in the embodiment previously described, six (seven in the case the buried well is to be provided) additional masks are required for the integration of a memory and the related high-voltage circuitry in a process for a low-voltage circuitry.

It will be apparent to those skilled in the art that the process flow previously described is not the only one that can be devised to implement the invention. Several variations can be contemplated.

The approach according to the invention can be applied whatever the type of memory cell, without any penalty on the memory cell's characteristics (dimensions and performances).

As an alternative to the previously described process, suitable when the memory cells do not require too high voltages, the source and drain regions of the high-voltage transistors could be formed by means of the same masks and implants used to form he source and drain regions for the low-voltage transistors. This means the source and drain regions for the high-voltage transistors will not be formed immediately after the formation of the high-voltage M and P wells (as in FIGS. 5, 6), but later, in the steps shown in FIGS. 15 to 19, modifying the layout of masks 32, 35, 40, 43. Also the high-voltage transistors will have an LDD structure.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. A process for the manufacturing of an integrated circuit including a low operating voltage, high-performance logic circuitry and an embedded memory device having a high operating voltage higher than said low operating voltage of the logic circuitry, the process comprising:

on first portions of a semiconductor substrate, forming a first gate oxide layer with a first thickness for first transistors operating at said high operating voltage;

on second portions of the semiconductor substrate, forming a second gate oxide layer with a second thickness for memory cells of the memory device;

on said first and second gate oxide layers, forming from a first polysilicon layer gate electrodes for the first transistors, and floating-gate electrodes for the memory cells;

in said first portions of the semiconductor substrate, forming source and drain regions for the first transistors;

after forming source and drain regions in the first portion, forming over the floating-gate electrodes of the memory cells a dielectric layer;

on third portions of the semiconductor substrate, forming a third gate oxide layer with a third thickness for second transistors operating at said low operating voltage;

on the dielectric layer and on said third portions of the semiconductor substrate, forming from a second polysilicon layer control gate electrodes for the memory cells, and gate electrodes for the second transistors;

in said second portions of the semiconductor substrate, forming source and drain regions for the memory cells; and in said third portions of the semiconductor substrate, forming source and drain regions for the second transistors.

2. The process according to claim 1, wherein said first gate oxide layer has a thickness of 100–200 Å, said second gate oxide layer has a thickness of 70–110 Å, and said third oxide layer has a thickness of 40–60 Å.

3. The process according to claim 1, further comprising forming, in said first portions of the semiconductor substrate, high-voltage well regions of a first and a second conductivity type for containing the first transistors.

4. The process according to claim 3 wherein said forming the high-voltage well regions provides for introducing into the first portions of the semiconductor substrate dopants of the first and second conductivity types in respective doses of $1-5\times10^{12}$ at/cm$^2$ and $1\times10^{12}-1\times10^{13}$ at/cm$^2$.

5. The process according to claim 4, further comprising forming, in said third portions of the semiconductor substrate, low-voltage well regions of a first and a second conductivity type for containing the second transistors.

6. The process according to claim 5 wherein said forming the low-voltage well regions provides for introducing into the third portions of the semiconductor substrate dopants of the first and second conductivity types in doses of $1\times10^{12}-1\times10^{13}$ at/cm$^2$.

7. The process according to claim 6 wherein said forming source and drain regions for the first transistors provides for introducing into the high-voltage well regions of the first and second conductivity type dopants of a second and a first conductivity type, respectively, in doses of $1\times10^{13}-1\times10^{14}$ at/cm$^2$.

8. The process according to claim 1 wherein said forming source and drain regions of the second transistors provides for forming lightly-doped source/drain portions adjacent the gate electrode of the second transistors, and forming more heavily doped source/drain portions spaced apart from the gate electrode of the second transistors.

9. The process according to claim 1 wherein said forming source and drain regions for the first transistor, and said forming source and drain regions for the second transistors, include forming, simultaneously for the first and second transistors, lightly-doped source/drain portions adjacent the gate electrodes of the first and second transistors, and forming more heavily doped source/drain portions spaced apart from the gate electrodes of the first and second transistors.

10. A process for manufacturing in integrated circuit including first and second transistors and a memory cell, the process comprising:

forming a first gate oxide layer on a first portion of a semiconductor substrate, for the first transistor;

forming a second gate oxide layer on a second portion of the semiconductor substrate, for the memory cell;

forming a third gate oxide layer on a third portion of the semiconductor substrate, for the second transistor;

forming a first polysilicon layer on the first and second gate oxide layers;

forming from the first polysilicon layer a gate electrode on, the first gate oxide layer for the first transistor and a floating-gate electrode of the memory cell on the second gate oxide layer;

in the first portion of the semiconductor substrate, forming source and drain regions for the first transistor;

after forming source and drain regions in the first portion, forming a dielectric layer over the floating-gate electrode of the memory cell;

forming a second polysilicon layer on the dielectric layer and on the third gate oxide layer;

forming from the second polysilicon layer a control gate electrode for the memory cell and a gate electrode for the second transistor;

in the second portion of the semiconductor substrate, forming source and drain regions for the memory cell; and in the third portion of the semiconductor substrate, forming source and drain regions for the second transistor, wherein forming source and drain regions for the first transistor includes:
  forming a first mask that covers the second and third portion and has an opening that leaves uncovered the gate electrode of the first transistor and the first portion of the semiconductor substrate;
  implanting dopants of a first conductivity type through the opening in the first mask, thereby forming a first well of the first conductivity type in the first portion; and
  implanting dopants of a second conductivity type through the opening in the first mask, thereby forming the source and drain regions for the first transistor.

11. The process of claim 10 wherein the first gate oxide layer has a thickness of 100–200 Å, the second gate oxide layer has a thickness of 70–110 Å, and the third oxide layer has a thickness of 40–60 Å.

12. The process of claim 10 wherein forming source and drain regions of the second transistor includes forming lightly-doped source/drain portions adjacent to the gate electrode of the second transistor, and forming more heavily doped source/drain portions spaced apart from the gate electrode of the second transistor.

13. The process of claim 10 wherein forming the dielectric layer includes forming the dielectric layer on the first polysilicon layer above the first and second gate oxide layers; wherein forming the second polysilicon layer includes forming the second polysilicon layer on the dielectric layer above the first and second gate oxide layers and on the third gate oxide layer; and wherein the second polysilicon layer is removed from the dielectric layer above the first gate oxide layer when forming the control gate electrode for the memory cell and the gate electrode for the second transistor.

14. The process of claim 10, further comprising simultaneously forming dielectric spacers adjacent to the gate electrodes of the first and third transistors and the control and floating gate electrodes of the memory cell.

15. The process of claim 10 wherein the first gate oxide layer has a thickness greater than a thickness of the third gate oxide layer.

16. The process of claim 10 wherein forming source and drain regions for the second transistor includes:
  forming a second mask that covers the first and second portions and has an opening that leaves uncovered the gate electrode of the second transistor and the third portion of the semiconductor substrate;
  implanting dopants of the second conductivity type through the opening in the first mask, thereby forming a second well of the second conductivity type in the third portion; and
  implanting dopants of the first conductivity type through the opening in the second mask, thereby forming the source and drain regions for the second transistor.

17. The process of claim 10 wherein the dopants of the first conductivity type are implanted with an implantation energy sufficient to penetrate both the first oxide layer and the first polysilicon layer.

18. The process of claim 10 wherein the dopants of the first conductivity type are implanted with an implantation energy of 150 to 400 KeV.

19. The process of claim 10 wherein the dopants of the second conductivity type are implanted with an implantation energy sufficient to penetrate both the first oxide layer and the first polysilicon layer.

20. The process of claim 10 wherein the dopants of the second conductivity type are implanted with an implantation energy of 150 to 300 KeV.

21. A process for manufacturing an integrated circuit including first and second transistors and a memory cell, the process comprising:
  forming a first gate oxide layer on a first portion of a semiconductor substrate, for the first transistor;
  forming a second gate oxide layer on a second portion of the semiconductor substrate, for the memory cell;
  forming a third gate oxide layer on a third portion of the semiconductor substrate for the second transistor;
  forming a first polysilicon layer on the first and second gate oxide layers;
  forming from the first polysilicon layer a gate electrode on the first gate oxide layer for the first transistor and a floating-gate electrode of the memory cell on the second gate oxide layer;
  in the first portion of the semiconductor substrate, forming source and drain regions for the first transistor;
  after forming source and drain regions in the first portion, forming a dielectric layer over the floating-gate electrode of the memory cell;
  forming a second polysilicon layer on the dielectric layer and on the third gate oxide layer;
  forming from the second polysilicon layer a control gate electrode for the memory cell and a gate electrode for the second transistor;
  in the second portion of the semiconductor substrate, forming source and drain regions for the memory cell; and
  in the third portion of the semiconductor substrate, forming source and drain regions for the second transistor, wherein forming the first gate oxide layer includes:
    forming an oxide layer over the first, second, and third portions of the substrate;
    forming on the oxide layer a first mask that covers the first and third portions and includes an opening over the second portion;
    removing a portion of the oxide layer through the opening; and
    implanting dopants through the opening to form a threshold implant of the memory cell.

22. The process of claim 21, further comprising:
  forming a second mask over the first and second portions, the second mask including an opening over the third portion;
  implanting dopants through the opening of the second mask and through the oxide layer over the third portion, thereby forming a well in the third portion;
  removing the oxide layer over the third portion such that only the first gate oxide layer remains of the oxide layer, wherein the third gate oxide layer is formed after removing the oxide layer over the third portion.

23. A process for manufacturing an integrated circuit including first and second transistors and a memory cell, the process comprising:
  forming a first gate oxide layer on a first portion of a semiconductor substrate, for the first transistor;
  forming a second gate oxide layer on a second portion of the semiconductor substrate, for the memory cell;
  forming a third gate oxide layer on a third portion of the semiconductor substrate, for the second transistor;
  forming a first polysilicon layer on the first and second gate oxide layers;
  forming from the first polysilicon layer a gate electrode on the first gate oxide layer for the first transistor and a floating-gate electrode of the memory cell on the second gate oxide layer;

in the first portion of the semiconductor substrate, forming source and drain well regions for the first transistor using implant energies greater than 150 KeV;

after forming source and drain regions in the first portion, forming a dielectric layer over the floating-gate electrode of the memory cell;

forming a second polysilicon layer on the dielectric layer and on the third gate oxide layer;

forming from the second polysilicon layer a control gate electrode for the memory cell and a gate electrode for the second transistor;

in the second portion of the semiconductor substrate, forming source and drain regions for the memory cell; and in the third portion of the semiconductor substrate, forming source and drain regions for the second transistor, wherein forming the first gate oxide layer includes forming an oxide layer over the first and third portions of the substrate; wherein forming the first polysilion layer includes:

forming the first polysilicon layer on the oxide layers over the first and third portions;

forming a mask that covers the first and second portions and includes an opening over the third portion; and removing a portion of the first polysilicon layer through the opening in the mask.

24. The process of claim 23 wherein forming the dielectric layer includes forming the dielectric layer on the first polysilicon layer above the first, second, and third portions; and removing a portion of the dielectric layer through the opening in the mask.

* * * * *

UNITED STATES PATENT AND TRADEMARK OFFICE
CERTIFICATE OF CORRECTION

PATENT NO.    : 6,410,387 B1                                              Page 1 of 1
DATED         : June 25, 2002
INVENTOR(S)   : Paolo Giuseppe Cappelletti et al.

It is certified that error appears in the above-identified patent and that said Letters Patent is hereby corrected as shown below:

<u>Title page,</u>
Item [56], References Cited, FOREIGN PATENT DOCUMENTS, the first reference should read as -- EP    0 854 509   A    7/1998 --.

<u>Column 7,</u>
Line 43, "in the first portion" should read as -- in the first portions --.

<u>Column 8,</u>
Line 49, "on, the first gate" should read as -- on the first gate --.

<u>Column 9,</u>
Lines 3 and 4, "second and third portion" should read as -- second and third portions --.

Signed and Sealed this

Fourth Day of February, 2003

JAMES E. ROGAN
*Director of the United States Patent and Trademark Office*